US012646553B2

(12) United States Patent
Tay et al.

(10) Patent No.: US 12,646,553 B2
(45) Date of Patent: Jun. 2, 2026

(54) READ MARGIN HEALTH EVALUATIONS FOR MEMORY SYSTEMS

(71) Applicant: Micron Technology, Inc., Boise, ID (US)

(72) Inventors: Yee Yang Tay, Singapore (SG); Chia Yu Kuo, Hukou (TW); Tjiu Karuna Bakti Sudarsono, Singapore (SG)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 18/787,977

(22) Filed: Jul. 29, 2024

(65) Prior Publication Data

US 2026/0031129 A1 Jan. 29, 2026

(51) Int. Cl.
*G11C 7/00* (2006.01)
*G11C 11/406* (2006.01)
*G11C 11/4074* (2006.01)

(52) U.S. Cl.
CPC .. *G11C 11/40615* (2013.01); *G11C 11/40622* (2013.01); *G11C 11/4074* (2013.01)

(58) Field of Classification Search
CPC ........ G11C 11/40615; G11C 11/40622; G11C 11/4074
USPC ........................................... 365/222
See application file for complete search history.

(56) References Cited

U.S. PATENT DOCUMENTS

| | | | | |
|---|---|---|---|---|
| 7,224,612 | B2 * | 5/2007 | Tanaka | G11C 16/3409 |
| | | | | 365/185.24 |
| 11,170,853 | B2 * | 11/2021 | Dasgupta | G11C 13/0033 |
| 11,615,854 | B2 * | 3/2023 | Sarpatwari | G11C 11/5642 |
| | | | | 365/185.24 |
| 11,797,982 | B2 * | 10/2023 | Coburn | G06Q 20/3678 |
| 11,842,783 | B2 * | 12/2023 | Muzzetto | G11C 13/003 |
| 12,014,775 | B2 * | 6/2024 | Sancon | G11C 13/0064 |
| 12,094,533 | B2 * | 9/2024 | Muzzetto | G11C 13/0004 |
| 12,112,801 | B2 * | 10/2024 | Bedeschi | G11C 13/0033 |
| 2024/0012576 | A1 * | 1/2024 | Martinelli | G06F 3/0655 |

FOREIGN PATENT DOCUMENTS

| | | | | |
|---|---|---|---|---|
| CN | 103187100 A | * | 7/2013 | G11C 29/50 |
| KR | 102359859 B1 | * | 2/2022 | G11C 11/2293 |

* cited by examiner

*Primary Examiner* — Viet Q Nguyen
(74) *Attorney, Agent, or Firm* — Holland & Hart LLP

(57) ABSTRACT

Methods, systems, and devices for read margin health evaluations for memory systems are described. A memory system may evaluate a read margin health for a set of memory cells (e.g., a page of memory cells, a block of memory cells) based on quantities of memory cells that activate in response to applying voltages to the set of memory cells. For example, the memory system may determine, for a pair of bias voltages between a first nominal voltage associated with a first logic state and a second nominal voltage associated with a second logic state, a respective quantity of memory cells of the set of memory cells that are activated in response to biasing the set of memory cells with each of the pair of voltages. Based on the quantities of activated memory cells, the memory system may determine whether to refresh the set of memory cells.

25 Claims, 5 Drawing Sheets

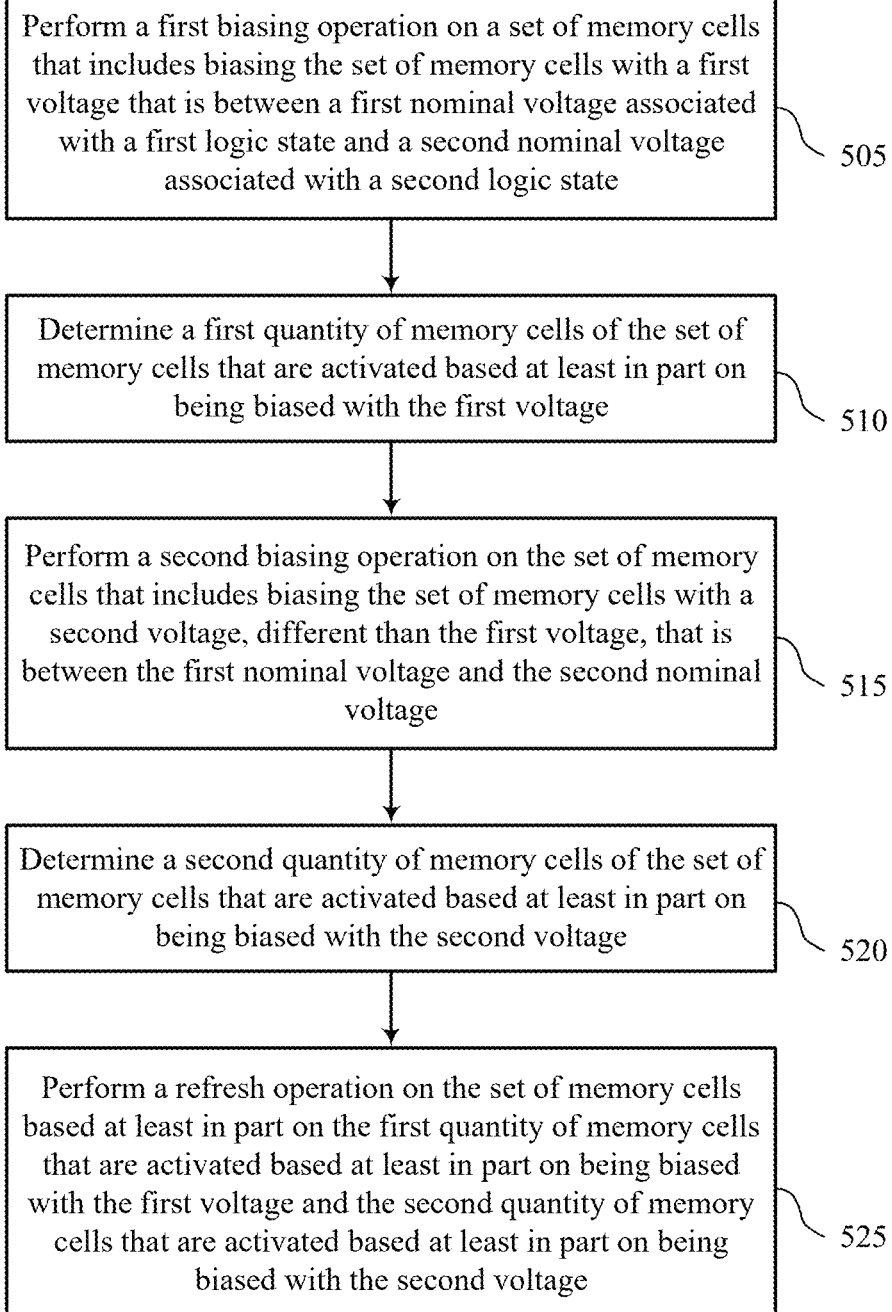

Perform a first biasing operation on a set of memory cells that includes biasing the set of memory cells with a first voltage that is between a first nominal voltage associated with a first logic state and a second nominal voltage associated with a second logic state

505

Determine a first quantity of memory cells of the set of memory cells that are activated based at least in part on being biased with the first voltage

510

Perform a second biasing operation on the set of memory cells that includes biasing the set of memory cells with a second voltage, different than the first voltage, that is between the first nominal voltage and the second nominal voltage

515

Determine a second quantity of memory cells of the set of memory cells that are activated based at least in part on being biased with the second voltage

520

Perform a refresh operation on the set of memory cells based at least in part on the first quantity of memory cells that are activated based at least in part on being biased with the first voltage and the second quantity of memory cells that are activated based at least in part on being biased with the second voltage

READ MARGIN HEALTH EVALUATIONS FOR MEMORY SYSTEMS

TECHNICAL FIELD

The following relates to one or more systems for memory, including read margin health evaluations for memory systems.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 5 shows a flowchart illustrating a method or methods that support read margin health evaluations for memory systems in accordance with examples as disclosed herein.

DETAILED DESCRIPTION

Figure 1:
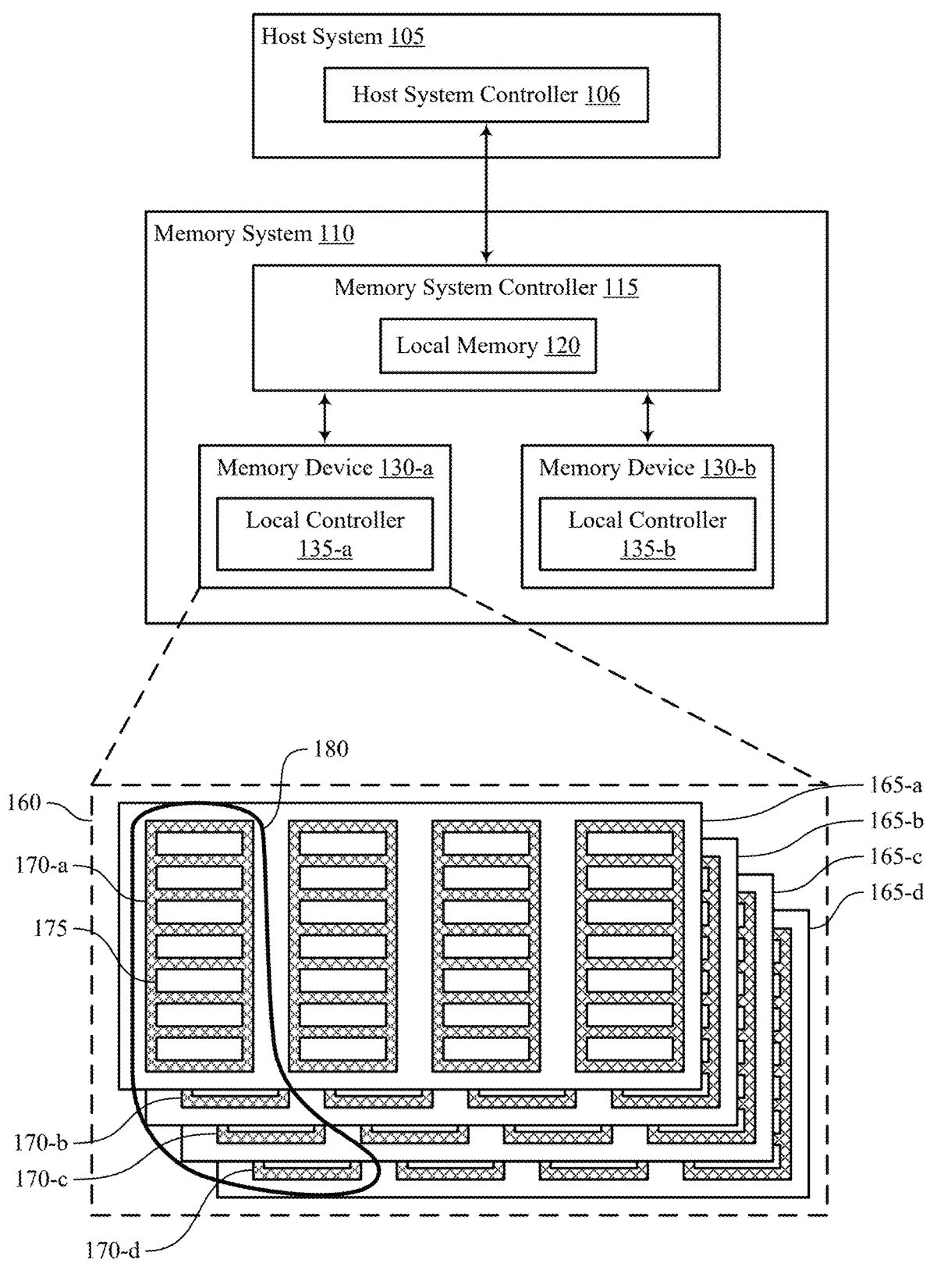
FIG. 1 shows an example of a system that supports read margin health evaluations for memory systems in accordance with examples as disclosed herein.

A memory system may implement charge-trapping materials in memory cells to set respective threshold voltages of memory cells to store information. For example, the memory system may, via a write operation, set the threshold voltages of memory cells to one or more target voltage levels (e.g., nominal voltages), each of which may correspond to (e.g., represent) a different logic state. A memory system may perform a read margin health evaluation (e.g., a media scan), which may determine whether written states of a set of memory cells have degraded. In some examples, an evaluation of a media scan may be based on a bit error count (BEC) when attempting to read a set of memory cells in accordance with a first read voltage level of a set of read voltage levels (e.g., for distinguishing between written target voltages), which may be referenced against a BEC for one or more other read voltage levels. However, due to various conditions (e.g., cross-temperature conditions, retention conditions, endurance conditions) of the memory system, the other target voltage levels, which may be used as a reference in the evaluation of the first target voltage level, may become shifted over time (e.g., may be shifted from a nominal value, compared to when the memory cells were written), which may result in a BEC for the first target voltage level that is relatively high. Thus, the media scan may result in false detection of read voltage errors (e.g., a false positive) which, in turn, may cause the memory system to waste resources in unnecessary remedial measures, among other challenges.

In accordance with examples described herein, a memory system may be configured to evaluate read margin health for a set of memory cells based on quantities of memory cells that are activated in response to applying voltages (e.g., biasing, applying a word line voltage, applying an activation voltage, applying an evaluation voltage) to the set of memory cells. For example, the memory system may determine, for a pair of bias voltages between a first nominal voltage associated with a first logic state and a second nominal voltage associated with a second logic state, a respective quantity of memory cells that are activated in response to biasing the set of memory cells with each of the pair of voltages. The pair of voltages may be associated with (e.g., centered around) a read voltage that distinguishes between the first logic state and the second logic state. Based on the respective quantities of memory cells that are activated in response to biasing the memory cells with each of the pair of bias voltages, the memory system may determine a read margin health for the set of memory cells, and may determine whether to refresh the set of memory cells based on the determined read margin health.

In addition to applicability in memory systems as described herein, techniques for read margin health evaluations for memory systems may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by decreasing latency and improving accuracy related to read margin health evaluations, which may decrease processing or latency times, improve response times, or otherwise improve user experience, among other benefits.

Features of the disclosure are illustrated and described in the context of systems, devices, and circuits. Features of the disclosure are further illustrated and described in the context of threshold voltage distributions, processes, block diagrams, and flowcharts.

FIG. 1 shows an example of a system 100 that supports read margin health evaluations for memory systems in accordance with examples as disclosed herein. The system 100 includes a host system 105 coupled with a memory system 110. The system 100 may be included in a computing device such as a desktop computer, a laptop computer, a network server, a mobile device, a vehicle, an Internet of Things (IoT) enabled device, an embedded computer (e.g., one included in a vehicle, industrial equipment, or a networked commercial device), or any other computing device that includes memory and a processing device.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other devices.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on the same die, within the same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*. A local controller 135 may be or include a microcontroller, special purpose logic circuitry (e.g., a field programmable gate array (FPGA), an application specific integrated circuit (ASIC), a digital signal processor (DSP)), or any other suitable processor or processing circuitry.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170 and, in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in the same page 175 may share (e.g., be coupled with) a common word line, and memory cells in the same string may share (e.g., be coupled with) a common digit line (which may alternatively be referred to as a bit line).

For some NAND architectures, memory cells may be read and programmed (e.g., written) at a first level of granularity (e.g., at a page level of granularity, or portion thereof) but may be erased at a second level of granularity (e.g., at a block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated, which may be due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

To write a state (e.g., a charge state, a threshold voltage level, a logic value, a single-bit value, a multi-bit value) to a memory cell, the memory system 110 may bias one or more access lines coupled with the memory cell so that the threshold voltage of the memory cell is set to a target level (e.g., a nominal voltage, a nominal threshold voltage) corresponding to that logic value. In general, $2^n$ levels may be used to store n bits in a memory cell. For example, a single level cell (SLC) may use one of two levels to store one bit, a multi-level cell (MLC) may use one of four levels to store two bits, a tri-level cell (TLC) may use one of eight levels to store three bits, a quad-level cell (QLC) may use one of 16 levels to store four bits, and so on. To read the logic value of a memory cell, the memory system 110 may compare the threshold voltage of the memory cell with one or more read voltages associated with the different logic values supported by the memory system 110. Comparing the threshold voltage of a memory cell with a read voltage may involve applying the read voltage to the memory cell and evaluating whether current flows through the memory cell in response to the read voltage being applied (e.g., to a gate node, to a word line).

Across a set (e.g., a page 175, a block 170) of memory cells, the threshold voltage (Vt) of memory cells written with the same logic value may vary, resulting in a distribution of threshold voltages (each respectively referred to as a Vt distribution) that are clustered around the target level (e.g., the nominal voltage, the nominal threshold voltage) for that logic value. Over time, memory cells may experience various phenomenon that distort or shift Vt distributions corresponding to one or more logic states, which may result in read errors. For example, memory cells may suffer from Vt drift (also referred to as slow charge loss) or some other phenomenon that causes threshold voltages of written memory cells to shift downward (e.g., decrease). Additionally, or alternatively, memory cells may suffer from read disturb, in which access operations (e.g., read operations, write operations) performed on one set of memory cells may cause the threshold voltages of neighboring cells to change. In some examples, Vt drift may be more pronounced for higher threshold voltages, and read disturb may be more pronounced for lower threshold voltages.

A memory system 110, or one or more components thereof (e.g., a memory system controller 115, a memory device 130, a local controller 135, or a combination thereof), may be configured to evaluate the health of read margins (e.g., to evaluate degradations in read margins caused by Vt shifts or read disturb, to evaluate an ability to distinguish between memory cells storing different logic states), which may be part of a media scan operation. In some cases, one or more components of a memory system 110 may determine that the read margin health associated with a set of memory cells (e.g., of a block 170, of a page 175) is below a threshold and may refresh the data in a set of memory cells (e.g., re-write, the data, which may involve reading the data from the set of memory cells and writing the read data to another set of memory cells). To avoid refreshing a set of memory cells unnecessarily, one or more components of a memory system 110 may refresh the set of memory cells in response to determining that read margin health is below the threshold. However, some techniques for detecting read margin health may be associated with high latency, or high false detection rates, or both, which may impair the performance of the memory system 110.

In accordance with examples as described herein, a memory system 110 or one or more components thereof (e.g., a memory system controller 115, a memory device 130, a local controller 135, or a combination thereof) may implement a read margin health evaluation that involves reduced latency and lower false detection rates relative to other read margin health evaluation techniques. For example, a memory system 110 (e.g., a memory system controller 115, a local controller 135, or a combination thereof) may evaluate a read margin health for a set of memory cells based on quantities of memory cells that activate in response to applying a given bias voltage to the set of memory cells, which may omit data decoding or performing error count detection. In some examples, one or more components of a memory system 110 may determine, for a pair of bias voltages between a first nominal voltage associated with a first logic state and a second nominal voltage associated with a second logic state, a respective quantity of memory cells of the set of memory cells that are activated in response to biasing the set of memory cells with each of the pair of voltages. The pair of voltages may be associated with (e.g., centered around) a read voltage used for distinguishing between the first logic state and the second logic state. Based on the quantities of memory cells that activate based on biasing the memory cells with each of the pair of bias voltages, the memory system 110 may determine a read margin health for the set of memory cells and may determine whether to refresh the set of memory cells according to the determined read margin health.

The system 100 may include any quantity of non-transitory computer readable media that support read margin health evaluations for memory systems. For example, the host system 105 (e.g., a host system controller 106), the memory system 110 (e.g., a memory system controller 115), or a memory device 130 (e.g., a local controller 135), or any combination thereof may include or otherwise may access one or more non-transitory computer readable media storing instructions (e.g., firmware, logic, code) for performing the functions ascribed herein to the host system 105, the memory system 110, or the memory device 130, or combination thereof. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

Figure 2:
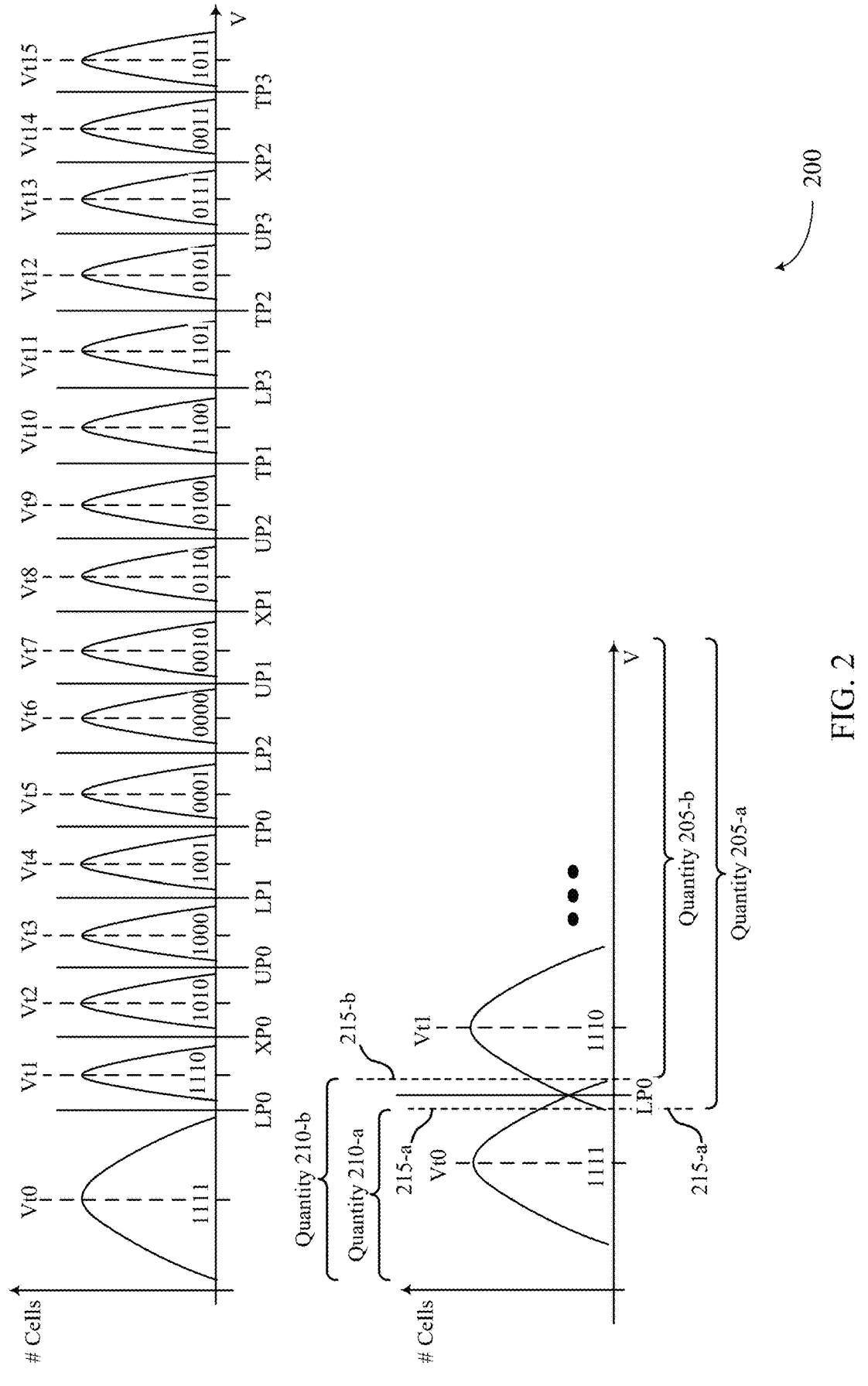
FIG. 2 shows an example of a threshold voltage (Vt) distribution arrangement that supports read margin health evaluations for memory systems in accordance with examples as disclosed herein.

FIG. 2 shows an example of a Vt distribution arrangement 200 that supports read margin health evaluations for memory systems in accordance with examples as disclosed herein. The Vt distribution arrangement 200 may illustrate a set of Vt distributions for QLCs, where a QLC refers to a memory cell that is configured to store four bits of data using one of sixteen Vt levels supported by the memory system 110 (e.g., by a memory device 130 of the memory system). Each of the Vt distributions may correspond to a respective QLC logic state, and may be associated with a respective voltage (e.g., a nominal voltage, a nominal threshold voltage, a target voltage, a nominal Vt, an average Vt), which may be a target threshold voltage written to memory cells for the respective QLC logic state (e.g., based on storing charge in a charge-trapping material of the memory cells). Thus, for the example of implementing QLCs, the Vt distribution arrangement 200 may include sixteen Vt distributions each associated with a respective voltage (e.g., sixteen nominal voltages, sixteen Vt levels, labeled Vt0 through Vt15). Each nominal Vt level may be associated with (e.g., correspond to, represent, store) a respective logic state (e.g., a multi-bit logic state, a 4-bit logic value for QLCs, a multi-bit value). For example, Vt0 and its Vt distribution may be associated with logic 1111, Vt1 and its Vt distribution may be associated with logic 1110, and so on, as illustrated. The Vt distribution for a nominal Vt level may be generally centered around the nominal Vt level (e.g., the nominal Vt level may be an average voltage for the Vt distribution), and the Vt distribution arrangement 200 may be illustrative of relative quantities of memory cells at various values of threshold voltage (e.g., among a population of memory cells, which may be written with a normalized distribution of, such as equal quantities of, the logic states).

Although described with reference to QLCs, the techniques described herein can be implemented using any type of threshold-voltage based memory cell, including SLCs that are configured to store a single bit in accordance with one of two threshold voltage levels (e.g., two nominal voltages), MLCs that are configured to store two bits in accordance with one of four threshold voltage levels (e.g., four nominal voltages), and TLCs that are configured to store three bits in accordance with one of eight threshold voltage levels (e.g., eight nominal voltages), and so on.

The Vt distribution arrangement 200 may include the threshold voltages of memory cells in a physical page (e.g., a page 175), or other granularity of memory cells (e.g., a block 170), and the bits associated with the threshold voltages may represent data from multiple logical pages associated with the physical page. For example, in the QLC context, a physical page may be associated with four stacked logical pages: a lower page (LP), an upper page (UP), an extra page (XP), and a top page (TP). In such an example, the least-significant bits of a physical page may represent the bits of the lower page, the second least-significant bits may represent the bits of the upper page, the second most-significant bits may represent the bits of the extra page, and the most-significant bits may represent the bits of the top page.

To read the bits of a logical page (e.g., to distinguish between Vt levels associated with a first bit value of the logical page and Vt levels associated with a second bit value of the logical page, to determine a set or quantity of memory cells that activate), a memory system 110 (e.g., a memory system controller 115, a memory device 130, a local memory controller 135) may be configured to apply a series of read voltages associated with that logical page. For instance, to read the bits of the lower page (e.g., to determine whether memory cells are storing an XXX0 logic state or an XXX1 logic state, where 'X' may be a 0 or 1 logic value not related to the lower page), the memory system 110 may apply each of the read voltages LP0 through LP3 (e.g., between sets of nominal Vt values associated with respective bit values of the lower page). To read the bits of the upper page (e.g., to determine whether memory cells are storing an XX0X logic state or an XX1X logic state, where 'X' may be a 0 or 1 logic value not related to the upper page), the memory system 110 may apply each of the read voltages UP0 through UP3. To read the bits of the extra page (e.g., to determine whether memory cells are storing an X0XX logic state or an X1XX logic state, where 'X' may be a 0 or 1 logic value not related to the extra page), the memory system 110 may apply each of the read voltages XP0 through XP2. To read the bits of the top page (e.g., to determine whether memory cells are storing an 0XXX logic state or an 1XXX logic state, where 'X' may be a 0 or 1 logic value not related to the top page), the memory system 110 may apply each of the read voltages TP0 through TP3. As shown, such read voltages may be between adjacent nominal Vt levels that distinguish between bit values of a given logical page.

A set of memory cells (e.g., memory cells of a physical page, of a page 175) represented by the Vt distribution arrangement 200 may be susceptible to various phenomenon that shift or otherwise alter the Vt distributions corresponding to the set of logic states (e.g., QLC states). For instance, over time, Vt distributions (e.g., and corresponding nominal voltages) may shift left (e.g., along a negative voltage direction), or experience an increased overlap, or both due to Vt drift. Accordingly, the read voltages used to read the memory cells may become inaccurate (e.g., may not be located between Vt distributions), which may reduce an ability of a memory system 110 to reliably distinguish between logic states during read operations (e.g., resulting in read errors, resulting in a relatively low read margin health). An ability of a memory system 110 to reliability distinguish between logic states during read operations may be referred to herein as a read margin health associated with the memory system 110. A read margin health may decrease as a result of Vt drift and read disturb, among other phenomenon or degradations (e.g., due to cross temperature conditions). In some cases, read margin health may vary with a nominal Vt level (e.g., with logic states associated with higher nominal Vt levels experiencing more Vt drift). Thus, it may be beneficial for a memory system 110 to evaluate read margin health individually for multiple nominal Vt levels (e.g., for multiple read voltages, for distinguishing between multiple logic states).

According to the techniques described herein, one or more components of a memory system 110 may evaluate read margin health for a set of memory cells (e.g., may detect that a set of memory cells has experienced read disturb or Vt shift) by counting respective quantities of memory cells (e.g., a quantity 210-*a*, a quantity 210-*b*) that activate as a result of biasing a set of memory cells with each of a pair of voltages. For example, a voltage 215-*a* and a voltage 215-*b* may each be used to bias the set of memory cells and to determine a quantity 210-*a* and a quantity 210-*b*, respectively, of memory cells that are activated in response to applying the voltage 215-*a* or the voltage 215-*b* (e.g., respective quantities of memory cells that are associated with Vt levels less than the voltage 215-*a* or the voltage 215-*b*). A value of the voltage 215-*a* may be based on the read voltage LP0 minus a first offset (e.g., as a negative offset) and a value of the voltage 215-*b* may be based on the read voltage LP0 plus a second offset (e.g., as a positive offset). The first offset and the second offset may be the same value (e.g., a same magnitude). In other words, the voltage 215-*a* and the voltage 215-*b* may be centered around the read voltage LP0 (e.g., for reading between logic 1111 and logic 1110) and may be offset from the read voltage LP0 in opposite directions. The voltage 215-*a* and the voltage 215-*b* may between Vt0 (e.g., a first nominal voltage, corresponding to a first logic state, logic 1111) and Vt1 (e.g., a second nominal voltage, corresponding to a second logic state, logic 1110).

In some examples, biasing the set of memory cells with the voltage 215-*a* and the voltage 215-*b* may be associated with performing one or more read operations on the set of memory cells using the voltage 215-*a* and the voltage 215-*b*. For example, the memory system 110 (e.g., a memory system controller 115, a local controller 135) may apply each of the voltage 215-*a* and the voltage 215-*b* to the set of memory cells, reading the raw data from the set of memory cells and summing the quantity of memory cells that are activated as a result of performing the read. In some examples, the read voltage LP0, for example, may be referred to as a lowest read voltage, a read voltage for differentiating between the lowest Vt distribution and the second lowest Vt distribution, a read voltage between Vt0 and Vt1, a read voltage for distinguishing between logic 1111 and other logic states (e.g., at least logic 1110), among other suitable terms.

One or more components of a memory system 110 may determine a read margin health of the set of memory cells (e.g., and determine whether to refresh the set of memory cells) based on the quantity 210-*a* and the quantity 210-*b*. In some examples, the memory system 110 may determine whether a difference between the quantity 210-*a* and the quantity 210-*b* satisfies a threshold (e.g., is greater than zero, is greater than an integer near zero). Additionally, or alternatively, the memory system 110 may determine whether an average of the quantity 210-*a* and the quantity 210-*b* satisfies a threshold. For instance, the memory system 110 may compare the average of the quantity 210-*a* and the quantity 210-*b* with a threshold quantity Rd_Thld, which may be the expected quantity of memory cells with Vt levels less than the read voltage LP0 before the set of memory cells experience degradation (e.g., Vt shift or read disturb). For example, if the memory system employs data scrambling during writing so that the respective quantities of memory cells in each of the logic states (e.g., 0000 through 1111) are equal (e.g., or roughly equal), the threshold quantity Rd_Thld may be based on (e.g., a function of) the quantity of Vt distributions. As an illustration in the context of QLCs, the threshold quantity Rd_Thld may be equal to $\frac{1}{16}$ (e.g., ~6%) of the total quantity of memory cells in the set of memory cells, where 16 is the quantity of logic states (e.g., the quantity of Vt distributions) and 1 is the quantity of logic states (e.g., Vt distributions) less than the read voltage LP0.

In some examples, the read margin health evaluation techniques described herein may be used to evaluate read margin health at multiple read voltages (e.g., LP0, XP0, UP0, LP1, and so on, of at least one page 175). For example, one or more components of a memory system 110 may perform the read margin health evaluation for each read voltage associated with a given page type (e.g., LP, XP, UP, or TP) or may perform the read margin health evaluation for each of the read voltages associated with the set of memory cells (e.g., the 16 read voltages associated with the Vt distribution arrangement 200). A memory system 110 may determine to refresh a set of memory cells (e.g., or a block 170 of memory cells including the set of memory cells) based on the quantities 205 (e.g., or quantities 210, representing quantities of memory cells that do not activate in response to an applied voltage 215) derived from one or multiple read margin health evaluations performed at one or more read voltages that distinguish between logic states (e.g., between Vt distributions).

Although described with reference to the quantity 205-*a* and the quantity 205-*b*, the read margin health evaluation may involve the use of different quantities, such as the quantity 210-*a* and the quantity 210-*b*, which may be the respective quantity of memory cells that do not activate in response to applying the voltage 215-a and the voltage 215-b, respectively (e.g., of memory cells that are associated with Vt levels greater than the voltage 215-a and the voltage 215-b, respectively). In such an example, an average of the quantity 210-a and the quantity 210-b may be compared to a threshold quantity that is equal to the total quantity of memory cells in the set of memory cells minus the threshold quantity Rd_Thld.

Thus, a memory system 110, or component thereof (e.g., a memory system controller 115, a memory device 130, a local controller 135, or any combination thereof) may perform a read margin health evaluation using the activation characteristics of quantities of memory cells (e.g., quantities 205, quantities 210, or a combination thereof), which may support a greater reliability and reduced latency relative to other read margin health evaluation techniques. For example, other methods of read margin health evaluation, such as evaluating the health of read margins using bit error counts, may result in unnecessary, time-consuming bit error rate calculations and/or a high rate of false positives in detecting read margin degradations, or may exceed an error-counting capability of an error detection scheme. Accordingly, read margin health evaluations that use activation characteristics of quantities of memory cells (e.g., quantities 205, quantities 210, or a combination thereof), as described herein, may reduce the latency and rate of false positives relative to other read margin health evaluation techniques, among other benefits.

Figure 3:
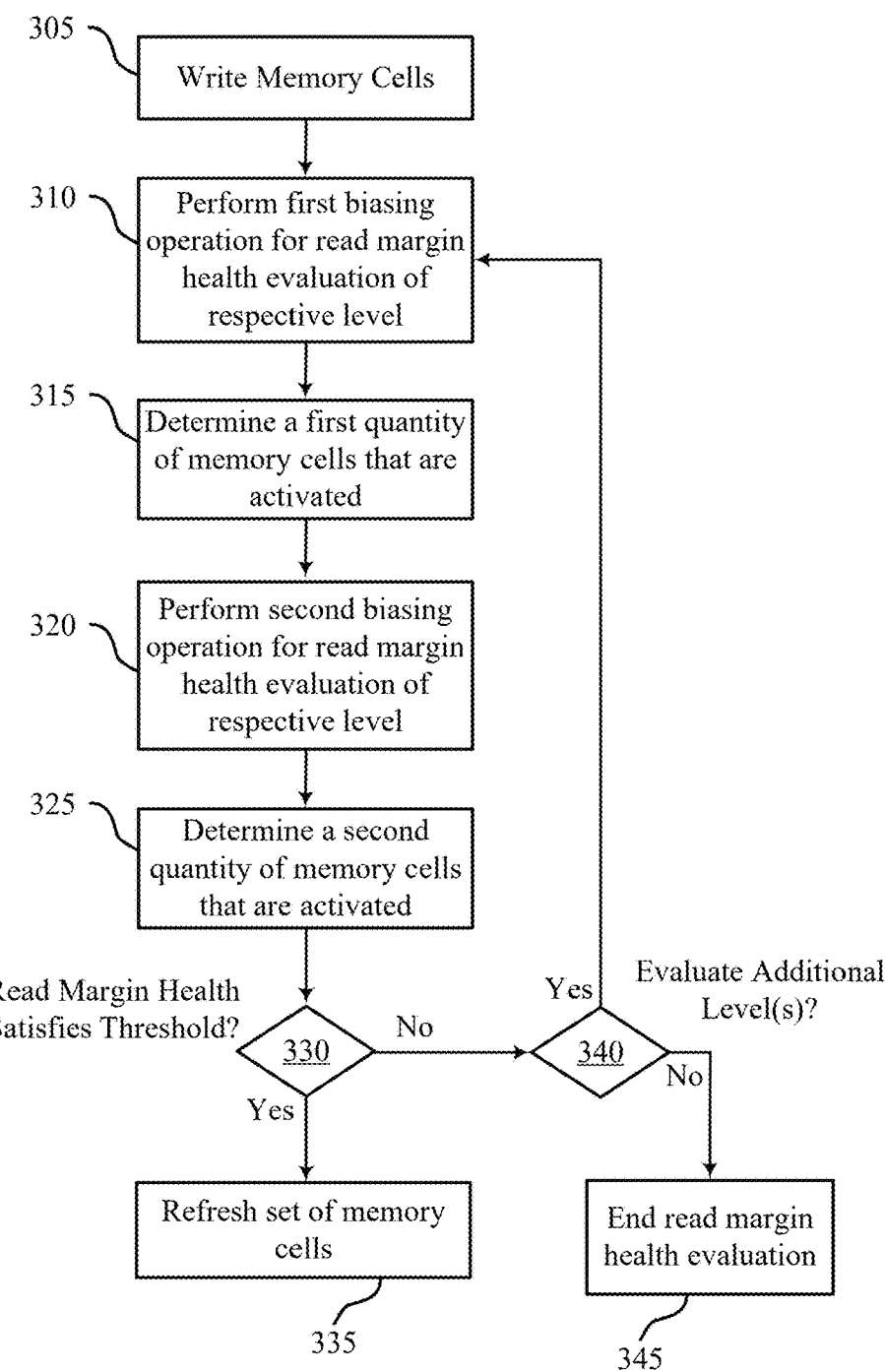
FIG. 3 shows an example of a process that supports read margin health evaluations for memory systems in accordance with examples as disclosed herein.

FIG. 3 shows an example of a process 300 that supports read margin health evaluations for memory systems in accordance with examples as disclosed herein. Aspects of the process 300 may be implemented by a memory system 110, or one or more components of a memory system 110 (e.g., a memory system controller 115, a memory device 130, a local controller 135). The process 300 may illustrate operations of read margin health evaluation techniques described herein. For example, process 300 may illustrate operations of a memory system 110, or one or more components thereof, that performs read margin health evaluations for a set of memory cells with Vt distributions as described with reference to FIG. 2.

Aspects of the process 300 may be implemented by one or more controllers, among other components. Additionally, or alternatively, aspects of the process 300 may be implemented as instructions stored in one or more memories (e.g., volatile memory, non-volatile memory). For example, the instructions, when executed by one or more controllers (e.g., a memory system controller 115, a local controller 135, or a combination thereof), may cause the one or more controllers (or a device or a system) to perform the operations of the process 300.

At 305, the process 300 may include writing (e.g., by a memory system 110, by a memory device 130) a set of memory cells (e.g., of a memory device 130, of a block 170, of a page 175) with a uniform distribution of logic states of a set of multiple logic states (e.g., 16 logic states, as described with reference to FIG. 2). For example, a memory system 110 may employ data scrambling during writing so that the quantities of memory cells in each of the Vt distributions are equal or approximately equal (e.g., within a threshold difference between logic states).

At 310, the process 300 may include performing (e.g., by the memory system 110, by the memory device 130) a first biasing operation on the set of memory cells. The first biasing operation may include biasing the set of memory cells with a first voltage (e.g., voltage 215-a) that is between a first nominal voltage (e.g., Vt0) associated with a first logic state (e.g., logic 1111) and a second nominal voltage (e.g., Vt1) associated with a second logic state (e.g., logic 1110). The first biasing operation may include biasing a respective gate of each memory cell of the set of memory cells with the first voltage. The first biasing operation may be part of a read margin health evaluation for a first read voltage value (e.g., LP0) of the Vt distribution. Additionally, or alternatively, the first biasing operation may be used to perform read margin health evaluations for each read voltage value of multiple read voltage values (e.g., each read voltage value of a given page type).

At 315, the process 300 may include determining (e.g., by the memory system 110, by the memory device 130) a first quantity of memory cells of the set of memory cells that are activated based on being biased with the first voltage. Determining the first quantity of memory cells that are activated may be based on detecting current flowing through the first quantity of memory cells while the respective gate of each memory cell is biased with the first voltage. For example, the current flowing through the first quantity of memory cells may be based on the first voltage satisfying a threshold (e.g., being greater than an activation voltage for the first quantity of memory cells).

At 320, the process 300 may include performing (e.g., by the memory system 110, by the memory device 130) a second biasing operation on the set of memory cells. The second biasing operation may include biasing the set of memory cells with a second voltage (e.g., voltage 215-b) that is different than the first voltage (e.g., voltage 215-a) and that is between the first nominal voltage (e.g., Vt0) and the second nominal voltage (e.g., Vt1). The second biasing operation may include biasing a respective gate of each memory cell of the set of memory cells with the second voltage. The second biasing operation may be part of the read margin health evaluation for the first read voltage value (e.g., LP0) of the Vt distribution. Additionally, or alternatively, the second biasing operation also may be used to perform read margin health evaluations for each read voltage value of multiple read voltage values (e.g., each read voltage value of a given page type).

At 325, the process 300 may include determining (e.g., by the memory system 110, by the memory device 130) a second quantity of memory cells of the set of memory cells that are activated based on being biased with the second voltage. Determining the second quantity of memory cells that are activated may be based on detecting current flowing through the second quantity of memory cells while the respective gate of each memory cell is biased with the second voltage. For example, the current flowing through the second quantity of memory cells may be based on the second voltage satisfying a threshold (e.g., being greater than an activation voltage for the second quantity of memory cells).

At 330, the process 300 may include determining (e.g., by the memory system 110, by the memory device 130) whether a read margin health for the respective Vt level under evaluation (e.g., Vt0, LP0, or both) satisfies a threshold based on values of the first quantity of memory cells and the second quantity of memory cells. For example, the memory system 110 or memory device 130 may determine that the read margin health for the respective Vt level satisfies a threshold based on a difference between the first quantity of memory cells and the second quantity of memory cells satisfying a first threshold (e.g., is greater than zero, is greater than an integer value near zero). Additionally, or alternatively, the memory system may determine whether an average of the first quantity of memory cells and the second quantity of memory cells satisfies a second threshold. The second threshold may be based on a third quantity of memory cells of the set of memory cells that are written in accordance with a nominal voltage (e.g., Vt0) that is less than the second nominal voltage (e.g., Vt1). For instance, the memory system may compare the average of the first quantity of memory cells and the second quantity of memory cells with a threshold quantity Rd_Thld, which may be the expected quantity of memory cells with Vt levels less than the read voltage under evaluation (e.g., LP0) before the set of memory cells experience read disturb or Vt shift. The threshold quantity Rd_Thld, as described in greater detail with reference to FIG. 2, may be based on having written the set of memory cells with a uniform distribution of logic states (e.g., at 305).

If, at 330, it is determined that the read margin health for the respective read voltage value (e.g., LP0) of the Vt distribution satisfies (e.g., is less than) the threshold based on the values of the first quantity of memory cells and the second quantity of memory cells, the process 300 may proceed to 335 where a refresh operation may be performed on the set of memory cells. For example, the set of memory cells may correspond to a page of memory cells (e.g., a page 175), and the memory system 110 or memory device 130 may perform a refresh operation on a block of memory cells (e.g., a block 170) that includes multiple pages of memory cells including the page. In some examples, the refresh operation may include reading data from the block of memory cells and writing the read data from the block of memory cells to a different block of memory cells.

If, at 330, it is determined that the read margin health for the respective level does not satisfy (e.g., is greater than) the threshold, the process 300 may proceed to 340 and include determining whether additional read voltage values of the Vt distribution are to be evaluated. For example, the memory system 110 or memory device 130 may determine whether the read voltage values associated with a respective page type (e.g., LP, XP, UP, TP) of the set of memory cells are to be evaluated (e.g., and have yet to be evaluated).

If, at 340, it is determined that no additional read voltage values of the Vt distribution will be evaluated, the process 300 may include refraining from performing a refresh operation on the set of memory cells and, at 345, the read margin health evaluation procedure may be concluded. In some examples, the first biasing operation (e.g., at 310) and the second biasing operation (e.g., at 320) may be used (e.g., by the memory system) to perform read margin health evaluations for each of multiple read voltage values (e.g., of a same page type, of all page types, which may be performed before the operations of 330 such that multiple read margins may be evaluated for a health metric at 330). For example, in response to performing the first biasing operation, a respective first quantity of memory cells may be determined (e.g., in parallel, simultaneously) for each of the multiple read voltage values. Similarly, in response to performing the second biasing operation, a respective second quantity of memory cells may be determined (e.g., in parallel, simultaneously) for each of the multiple read voltage values. In some cases, performing refresh on the set of memory cells (e.g., at 335) may be based on one or more of the read margin health evaluations for the multiple read voltage values. In some examples, two reads (e.g., only two reads) may be performed for the first biasing operation of 310 and the second biasing operation of 320 (e.g., for one or more levels, for all levels), and a health check metric (e.g., quantities of memory cells that are activated) may be collected in parallel (e.g., at all levels, corresponding to a same logical page type).

If, at 340, it is determined that at least another read voltage value (e.g., LP1) of the Vt distribution is to be evaluated, the process 300 may loop back to 310, where a read margin health evaluation may be performed for at least the second read voltage value (e.g., in accordance with the operations of 310 through 330). For example, as part of the read margin health evaluation for a second read voltage value (e.g., LP1), the memory system 110 or memory device 130 may bias the set of memory cells with each of a third voltage and a fourth voltage that are between a third nominal voltage (e.g., Vt3) and a fourth nominal voltage (e.g., Vt4). In some cases, the process 300 may include performing respective read margin health evaluations for each read voltage value of a given page type. In an illustrative example, the process 300 may include performing read margin health evaluations in accordance with the techniques described herein for each of the read voltages LP0, the LP1, the LP2, and the LP3. In another example, a different page type may be selected for read margin health evaluation (e.g., XP, UP, TP) according to the described techniques.

Thus, a memory system 110 or a memory device 130 may perform a read margin health evaluation procedure to evaluate respective read margins for one or multiple read voltage values of a Vt distribution as described herein, which may improve the performance of the memory system 110 or memory device 130 by supporting increased data reliability and by satisfying an expected codeword error trigger rate of the memory system 110 or memory device 130. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 4:
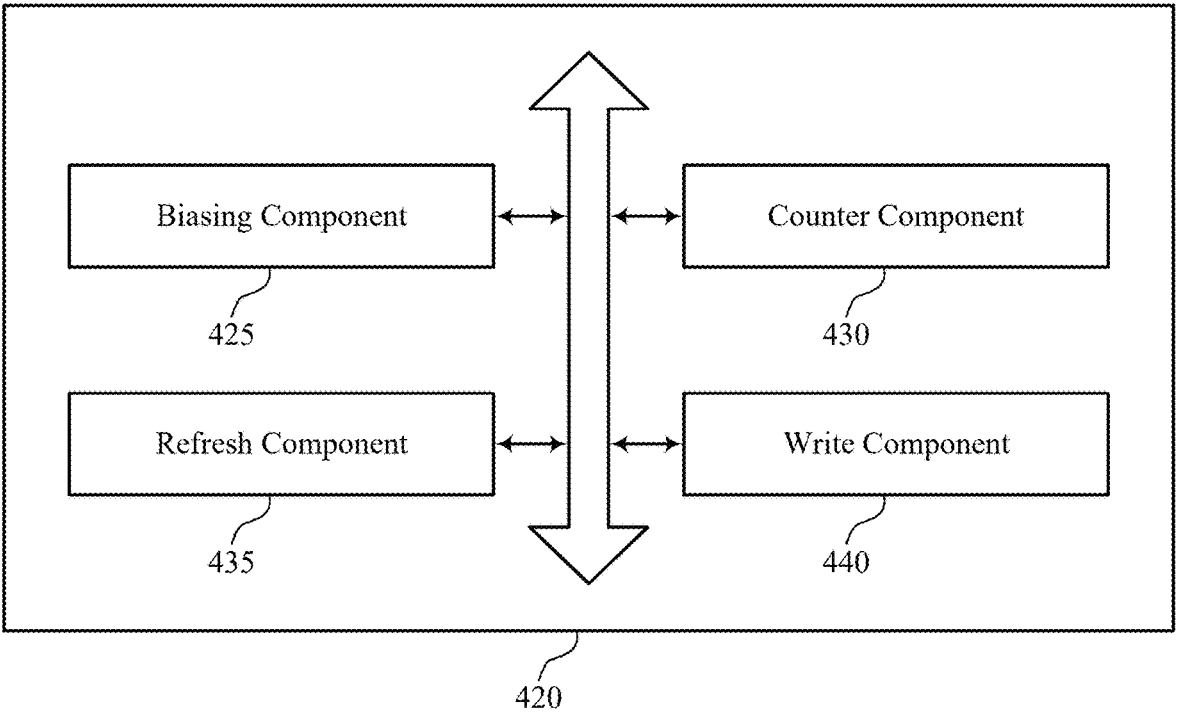
FIG. 4 shows a block diagram of a memory system that supports read margin health evaluations for memory systems in accordance with examples as disclosed herein.

FIG. 4 shows a block diagram 400 of a memory system 420 that supports read margin health evaluations for memory systems in accordance with examples as disclosed herein. The memory system 420 may be an example of aspects of a memory system as described with reference to FIGS. 1 through 3 (e.g., as a memory device 130, as a set of multiple memory devices 130, as a set of one or more memory devices 130 coupled with a memory system controller 115). The memory system 420, or various components thereof, may be an example of means for performing various aspects of read margin health evaluations for memory systems as described herein. For example, the memory system 420 may include a biasing component 425, a counter component 430, a refresh component 435, a write component 440, or any combination thereof. Each of these components, or components of subcomponents thereof (e.g., one or more processors, one or more memories), may communicate, directly or indirectly, with one another (e.g., via one or more buses).

The biasing component 425 may be configured as or otherwise support a means for performing a first biasing operation on a set of memory cells (e.g., one or more pages 175) that includes biasing the set of memory cells with a first voltage that is between a first nominal voltage associated with a first logic state and a second nominal voltage associated with a second logic state. The counter component 430 may be configured as or otherwise support a means for determining a first quantity of memory cells of the set of memory cells that are activated based at least in part on being biased with the first voltage. In some examples, the biasing component 425 may be configured as or otherwise support a means for performing a second biasing operation on the set of memory cells that includes biasing the set of memory cells with a second voltage, different than the first voltage, that is between the first nominal voltage and the second nominal voltage. In some examples, the counter component 430 may be configured as or otherwise support a means for determining a second quantity of memory cells of the set of memory cells that are activated based at least in part on being biased with the second voltage. The refresh component 435 may be configured as or otherwise support a means for performing a refresh operation on the set of memory cells based at least in part on the first quantity of memory cells that are activated based at least in part on being biased with the first voltage and the second quantity of memory cells that are activated based at least in part on being biased with the second voltage.

In some examples, performing the first biasing operation includes biasing a respective gate of each memory cell of the set of memory cells (e.g., via a word line associated with the set of memory cells) with the first voltage, and determining the first quantity of memory cells that are activated may be based at least in part on current flowing through the first quantity of memory cells while the respective gate of each memory cell is biased with the first voltage. In some examples, performing the second biasing operation includes biasing the respective gate of each memory cell of the set of memory cells with the second voltage, where determining the second quantity of memory cells that are activated is based at least in part on current flowing through the second quantity of memory cells while the respective gate of each memory cell is biased with the second voltage.

In some examples, performing the refresh operation may be based at least in part on whether a difference between the first quantity of memory cells and the second quantity of memory cells satisfies a threshold.

In some examples, performing the refresh operation may be based at least in part on whether an average of the first quantity of memory cells and the second quantity of memory cells satisfies a threshold.

In some examples, the threshold may be based at least in part on a third quantity of memory cells of the set of memory cells that are written in accordance with a nominal voltage that is less than the second nominal voltage.

In some examples, the biasing component 425 may be configured as or otherwise support a means for performing a third biasing operation on the set of memory cells that includes biasing the set of memory cells with a third voltage that is between a third nominal voltage associated with a third logic state and a fourth nominal voltage associated with a fourth logic state. In some examples, the counter component 430 may be configured as or otherwise support a means for determining a third quantity of memory cells of the set of memory cells that are activated based at least in part on being biased with the third voltage. In some examples, the biasing component 425 may be configured as or otherwise support a means for performing a fourth biasing operation on the set of memory cells that includes biasing the set of memory cells with a fourth voltage, different than the third voltage, that is between the third nominal voltage and the fourth nominal voltage. In some examples, the counter component 430 may be configured as or otherwise support a means for determining a fourth quantity of memory cells of the set of memory cells that are activated based at least in part on being biased with the fourth voltage, where performing the refresh operation on the set of memory cells is further based at least in part on the third quantity of memory cells that are activated based at least in part on being biased with the third voltage and the fourth quantity of memory cells that are activated based at least in part on being biased with the fourth voltage.

In some examples, the first logic state and the third logic state may be associated with a first bit value in accordance with a page type of the set of memory cells, and the second logic state and the fourth logic state are associated with a second bit value in accordance with the page type of the set of memory cells.

In some examples, the set of memory cells corresponds to a page 175 of memory cells and, to support performing the refresh operation, the refresh component 435 may be configured as or otherwise support a means for performing the refresh operation on a block of memory cells (e.g., a block 170) including a plurality of pages of memory cells (e.g., a plurality of pages 175) that includes the page of memory cells.

In some examples, the first voltage is associated with a read voltage for distinguishing between the first logic state and the second logic state plus a first offset, and the second voltage is associated with the read voltage for distinguishing between the first logic state and the second logic state minus a second offset.

In some examples, the write component 440 may be configured as or otherwise support a means for writing the set of memory cells with a uniform distribution of logic states of a plurality of logic states that include the first logic state and the second logic state.

In some examples, the described functionality of the memory system 420, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 420, or various components thereof, may be implemented at least in part by instructions (e.g., stored in memory, non-transitory computer-readable medium) executable by such at least one processor.

FIG. 5 shows a flowchart illustrating a method 500 that supports read margin health evaluations for memory systems in accordance with examples as disclosed herein. The operations of method 500 may be implemented by a memory system 110 or its components (e.g., one or more memory devices 130) as described herein. For example, the operations of method 500 may be performed by a memory system 110 or a memory device 130 as described with reference to FIGS. 1 through 4. In some examples, a memory system 110 or a memory device 130 may execute a set of instructions to control the functional elements of the device to perform the described functions. Additionally, or alternatively, a memory system 110 or a memory device 130 may perform aspects of the described functions using special-purpose hardware.

At 505, the method may include performing a first biasing operation on a set of memory cells that includes biasing the set of memory cells with a first voltage that is between a first nominal voltage associated with a first logic state and a second nominal voltage associated with a second logic state. In some examples, aspects of the operations of 505 may be performed by a biasing component 425 as described with reference to FIG. 4.

At 510, the method may include determining a first quantity of memory cells of the set of memory cells that are activated based at least in part on being biased with the first voltage. In some examples, aspects of the operations of 510 may be performed by a counter component 430 as described with reference to FIG. 4.

At 515, the method may include performing a second biasing operation on the set of memory cells that includes biasing the set of memory cells with a second voltage, different than the first voltage, that is between the first nominal voltage and the second nominal voltage. In some examples, aspects of the operations of 515 may be performed by a biasing component 425 as described with reference to FIG. 4.

At 520, the method may include determining a second quantity of memory cells of the set of memory cells that are activated based at least in part on being biased with the second voltage. In some examples, aspects of the operations of 520 may be performed by a counter component 430 as described with reference to FIG. 4.

At 525, the method may include performing a refresh operation on the set of memory cells based at least in part on the first quantity of memory cells that are activated based at least in part on being biased with the first voltage and the second quantity of memory cells that are activated based at least in part on being biased with the second voltage. In some examples, aspects of the operations of 525 may be performed by a refresh component 435 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for performing a first biasing operation on a set of memory cells that includes biasing the set of memory cells with a first voltage that is between a first nominal voltage associated with a first logic state and a second nominal voltage associated with a second logic state; determining a first quantity of memory cells of the set of memory cells that are activated based at least in part on being biased with the first voltage; performing a second biasing operation on the set of memory cells that includes biasing the set of memory cells with a second voltage, different than the first voltage, that is between the first nominal voltage and the second nominal voltage; determining a second quantity of memory cells of the set of memory cells that are activated based at least in part on being biased with the second voltage; and performing a refresh operation on the set of memory cells based at least in part on the first quantity of memory cells that are activated based at least in part on being biased with the first voltage and the second quantity of memory cells that are activated based at least in part on being biased with the second voltage.

Aspect 2: The method, apparatus, or non-transitory computer-readable medium of aspect 1, where performing the first biasing operation includes biasing a respective gate of each memory cell of the set of memory cells with the first voltage, where determining the first quantity of memory cells that are activated is based at least in part on current flowing through the first quantity of memory cells while the respective gate of each memory cell is biased with the first voltage and performing the second biasing operation includes biasing the respective gate of each memory cell of the set of memory cells with the second voltage, where determining the second quantity of memory cells that are activated is based at least in part on current flowing through the second quantity of memory cells while the respective gate of each memory cell is biased with the second voltage.

Aspect 3: The method, apparatus, or non-transitory computer-readable medium of any of aspects 1 through 2, where performing the refresh operation is based at least in part on whether a difference between the first quantity of memory cells and the second quantity of memory cells satisfies a threshold.

Aspect 4: The method, apparatus, or non-transitory computer-readable medium of any of aspects 1 through 3, where performing the refresh operation is based at least in part on whether an average of the first quantity of memory cells and the second quantity of memory cells satisfies a threshold.

Aspect 5: The method, apparatus, or non-transitory computer-readable medium of aspect 4, where the threshold is based at least in part on a third quantity of memory cells of the set of memory cells that are written in accordance with a nominal voltage that is less than the second nominal voltage.

Aspect 6: The method, apparatus, or non-transitory computer-readable medium of any of aspects 1 through 5, further including operations, features, circuitry, logic, means, or instructions, or any combination thereof for performing a third biasing operation on the set of memory cells that includes biasing the set of memory cells with a third voltage that is between a third nominal voltage associated with a third logic state and a fourth nominal voltage associated with a fourth logic state; determining a third quantity of memory cells of the set of memory cells that are activated based at least in part on being biased with the third voltage; performing a fourth biasing operation on the set of memory cells that includes biasing the set of memory cells with a fourth voltage, different than the third voltage, that is between the third nominal voltage and the fourth nominal voltage; and determining a fourth quantity of memory cells of the set of memory cells that are activated based at least in part on being biased with the fourth voltage, where performing the refresh operation on the set of memory cells is further based at least in part on the third quantity of memory cells that are activated based at least in part on being biased with the third voltage and the fourth quantity of memory cells that are activated based at least in part on being biased with the fourth voltage.

Aspect 7: The method, apparatus, or non-transitory computer-readable medium of aspect 6, where the first logic state and the third logic state are associated with a first bit value in accordance with a page type of the set of memory cells, and the second logic state and the fourth logic state are associated with a second bit value in accordance with the page type of the set of memory cells.

Aspect 8: The method, apparatus, or non-transitory computer-readable medium of any of aspects 1 through 7, where the set of memory cells corresponds to a page of memory cells, and performing the refresh operation includes operations, features, circuitry, logic, means, or instructions, or any combination thereof for performing the refresh operation on a block of memory cells including a plurality of pages of memory cells that includes the page of memory cells.

Aspect 9: The method, apparatus, or non-transitory computer-readable medium of any of aspects 1 through 8, where the first voltage is associated with a read voltage for distinguishing between the first logic state and the second logic state plus a first offset, and the second voltage is associated with the read voltage for distinguishing between the first logic state and the second logic state minus a second offset.

Aspect 10: The method, apparatus, or non-transitory computer-readable medium of any of aspects 1 through 9, further including operations, features, circuitry, logic, means, or instructions, or any combination thereof for writing the set of memory cells with a uniform distribution of logic states of a plurality of logic states that include the first logic state and the second logic state.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processing system (e.g., one or more processors, one or more controllers, control circuitry, processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processors. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium, or combination of multiple media, which can be accessed by a computer. By way of example, and not limitation, non-transitory computer-readable media can comprise RAM, ROM, electrically erasable programmable read-only memory (EEPROM), optical disk storage, magnetic disk storage or other magnetic storage devices, or any other non-transitory medium or combination of media that can be used to carry or store desired program code means in the form of instructions or data structures and that can be accessed by a computer, or one or more processors.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:

one or more memory devices; and processing circuitry coupled with the one or more memory devices and configured to cause the memory system to:

perform a first biasing operation on a set of memory cells that includes biasing the set of memory cells with a first voltage that is between a first nominal voltage associated with a first logic state and a second nominal voltage associated with a second logic state;

determine a first quantity of memory cells of the set of memory cells that are activated based at least in part on being biased with the first voltage;

perform a second biasing operation on the set of memory cells that includes biasing the set of memory cells with a second voltage, different than the first voltage, that is between the first nominal voltage and the second nominal voltage;

determine a second quantity of memory cells of the set of memory cells that are activated based at least in part on being biased with the second voltage; and perform a refresh operation on the set of memory cells based at least in part on the first quantity of memory cells that are activated based at least in part on being biased with the first voltage and the second quantity of memory cells that are activated based at least in part on being biased with the second voltage.

2. The memory system of claim 1, wherein:

performing the first biasing operation includes biasing a respective gate of each memory cell of the set of memory cells with the first voltage, wherein determining the first quantity of memory cells that are activated is based at least in part on current flowing through the first quantity of memory cells while the respective gate of each memory cell is biased with the first voltage; and performing the second biasing operation includes biasing the respective gate of each memory cell of the set of memory cells with the second voltage, wherein determining the second quantity of memory cells that are activated is based at least in part on current flowing through the second quantity of memory cells while the respective gate of each memory cell is biased with the second voltage.

3. The memory system of claim 1, wherein performing the refresh operation is based at least in part on whether a difference between the first quantity of memory cells and the second quantity of memory cells satisfies a threshold.

4. The memory system of claim 1, wherein performing the refresh operation is based at least in part on whether an average of the first quantity of memory cells and the second quantity of memory cells satisfies a threshold.

5. The memory system of claim 4, wherein the threshold is based at least in part on a third quantity of memory cells of the set of memory cells that are written in accordance with a nominal voltage that is less than the second nominal voltage.

6. The memory system of claim 1, wherein the processing circuitry is further configured to cause the memory system to:

perform a third biasing operation on the set of memory cells that includes biasing the set of memory cells with a third voltage that is between a third nominal voltage associated with a third logic state and a fourth nominal voltage associated with a fourth logic state;

determine a third quantity of memory cells of the set of memory cells that are activated based at least in part on being biased with the third voltage;

perform a fourth biasing operation on the set of memory cells that includes biasing the set of memory cells with a fourth voltage, different than the third voltage, that is between the third nominal voltage and the fourth nominal voltage; and determine a fourth quantity of memory cells of the set of memory cells that are activated based at least in part on being biased with the fourth voltage, wherein performing the refresh operation on the set of memory cells is further based at least in part on the third quantity of memory cells that are activated based at least in part on being biased with the third voltage and the fourth quantity of memory cells that are activated based at least in part on being biased with the fourth voltage.

7. The memory system of claim 6, wherein the first logic state and the third logic state are associated with a first bit value in accordance with a page type of the set of memory cells, and the second logic state and the fourth logic state are associated with a second bit value in accordance with the page type of the set of memory cells.

8. The memory system of claim 1, wherein the set of memory cells corresponds to a page of memory cells, and wherein, to perform the refresh operation, the processing circuitry is configured to cause the memory system to:

perform the refresh operation on a block of memory cells comprising a plurality of pages of memory cells that includes the page of memory cells.

9. The memory system of claim 1, wherein the first voltage is associated with a read voltage for distinguishing between the first logic state and the second logic state plus a first offset, and the second voltage is associated with the read voltage for distinguishing between the first logic state and the second logic state minus a second offset.

10. The memory system of claim 1, wherein the processing circuitry is further configured to cause the memory system to:

write the set of memory cells with a uniform distribution of logic states of a plurality of logic states that include the first logic state and the second logic state.

11. A method by a memory system, comprising:

performing a first biasing operation on a set of memory cells that includes biasing the set of memory cells with a first voltage that is between a first nominal voltage associated with a first logic state and a second nominal voltage associated with a second logic state;

determining a first quantity of memory cells of the set of memory cells that are activated based at least in part on being biased with the first voltage;

performing a second biasing operation on the set of memory cells that includes biasing the set of memory cells with a second voltage, different than the first voltage, that is between the first nominal voltage and the second nominal voltage;

determining a second quantity of memory cells of the set of memory cells that are activated based at least in part on being biased with the second voltage; and performing a refresh operation on the set of memory cells based at least in part on the first quantity of memory cells that are activated based at least in part on being biased with the first voltage and the second quantity of memory cells that are activated based at least in part on being biased with the second voltage.

12. The method of claim 11, wherein:

performing the first biasing operation includes biasing a respective gate of each memory cell of the set of memory cells with the first voltage, wherein determining the first quantity of memory cells that are activated is based at least in part on current flowing through the first quantity of memory cells while the respective gate of each memory cell is biased with the first voltage; and performing the second biasing operation includes biasing the respective gate of each memory cell of the set of memory cells with the second voltage, wherein determining the second quantity of memory cells that are activated is based at least in part on current flowing through the second quantity of memory cells while the respective gate of each memory cell is biased with the second voltage.

13. The method of claim 11, wherein performing the refresh operation is based at least in part on whether a difference between the first quantity of memory cells and the second quantity of memory cells satisfies a threshold.

14. The method of claim 11, wherein performing the refresh operation is based at least in part on whether an average of the first quantity of memory cells and the second quantity of memory cells satisfies a threshold.

15. The method of claim 14, wherein the threshold is based at least in part on a third quantity of memory cells of the set of memory cells that are written in accordance with a nominal voltage that is less than the second nominal voltage.

16. The method of claim 11, further comprising:

performing a third biasing operation on the set of memory cells that includes biasing the set of memory cells with a third voltage that is between a third nominal voltage associated with a third logic state and a fourth nominal voltage associated with a fourth logic state;

determining a third quantity of memory cells of the set of memory cells that are activated based at least in part on being biased with the third voltage;

performing a fourth biasing operation on the set of memory cells that includes biasing the set of memory cells with a fourth voltage, different than the third voltage, that is between the third nominal voltage and the fourth nominal voltage; and determining a fourth quantity of memory cells of the set of memory cells that are activated based at least in part on being biased with the fourth voltage, wherein performing the refresh operation on the set of memory cells is further based at least in part on the third quantity of memory cells that are activated based at least in part on being biased with the third voltage and the fourth quantity of memory cells that are activated based at least in part on being biased with the fourth voltage.

17. The method of claim 16, wherein the first logic state and the third logic state are associated with a first bit value in accordance with a page type of the set of memory cells, and the second logic state and the fourth logic state are associated with a second bit value in accordance with the page type of the set of memory cells.

18. The method of claim 11, wherein the set of memory cells corresponds to a page of memory cells, and performing the refresh operation comprises:

performing the refresh operation on a block of memory cells comprising a plurality of pages of memory cells that includes the page of memory cells.

19. The method of claim 11, wherein:

the first voltage is associated with a read voltage for distinguishing between the first logic state and the second logic state plus a first offset; and the second voltage is associated with the read voltage for distinguishing between the first logic state and the second logic state minus a second offset.

20. The method of claim 11, further comprising:

writing the set of memory cells with a uniform distribution of logic states of a plurality of logic states that include the first logic state and the second logic state.

21. A non-transitory computer-readable medium storing code comprising instructions which, when executed by processing circuitry of a memory system, cause the memory system to:

perform a first biasing operation on a set of memory cells that includes biasing the set of memory cells with a first voltage that is between a first nominal voltage associated with a first logic state and a second nominal voltage associated with a second logic state;

determine a first quantity of memory cells of the set of memory cells that are activated based at least in part on being biased with the first voltage;

perform a second biasing operation on the set of memory cells that includes biasing the set of memory cells with a second voltage, different than the first voltage, that is between the first nominal voltage and the second nominal voltage;

determine a second quantity of memory cells of the set of memory cells that are activated based at least in part on being biased with the second voltage; and perform a refresh operation on the set of memory cells based at least in part on the first quantity of memory cells that are activated based at least in part on being biased with the first voltage and the second quantity of memory cells that are activated based at least in part on being biased with the second voltage.

22. The non-transitory computer-readable medium of claim 21, wherein:

the instructions to perform the first biasing operation, when executed by the processing circuitry of the memory system, cause the memory system to bias a respective gate of each memory cell of the set of memory cells with the first voltage, wherein determining the first quantity of memory cells that are activated is based at least in part on current flowing through the first quantity of memory cells while the respective gate of each memory cell is biased with the first voltage; and the instructions to perform the second biasing operation, when executed by the processing circuitry of the memory system, cause the memory system to bias the respective gate of each memory cell of the set of memory cells with the second voltage, wherein determining the second quantity of memory cells that are activated is based at least in part on current flowing through the second quantity of memory cells while the respective gate of each memory cell is biased with the second voltage.

23. The non-transitory computer-readable medium of claim 21, wherein performing the refresh operation is based at least in part on whether a difference between the first quantity of memory cells and the second quantity of memory cells satisfies a threshold.

24. The non-transitory computer-readable medium of claim 21, wherein performing the refresh operation is based at least in part on whether an average of the first quantity of memory cells and the second quantity of memory cells satisfies a threshold.

25. The non-transitory computer-readable medium of claim 21, wherein the set of memory cells corresponds to a page of memory cells and the instructions to perform the refresh operation, when executed by the processing circuitry of the memory system, cause the memory system to:

perform the refresh operation on a block of memory cells comprising a plurality of pages of memory cells that includes the page of memory cells.

\* \* \* \* \*